United States Patent [19]

Gianni

[11] 4,080,026
[45] Mar. 21, 1978

[54] MULTI-LEVEL SOCKET FOR AN INTEGRATED CIRCUIT

[76] Inventor: Richard Gianni, 216 Livorna Heights, Alamo, Calif. 94507

[21] Appl. No.: 736,577

[22] Filed: Oct. 28, 1976

[51] Int. Cl.² .............................................. H05K 1/16
[52] U.S. Cl. ................................................ 339/17 CF
[58] Field of Search ................ 339/17 CF; 174/52 FP

[56] References Cited

U.S. PATENT DOCUMENTS

| | | | |
|---|---|---|---|
| 3,605,062 | 9/1971 | Tinkelenberg | 339/17 CF |
| 3,622,950 | 11/1971 | Millinger | 339/17 CF |
| 3,668,604 | 6/1972 | Rossman | 339/17 CF |
| 3,693,131 | 9/1972 | Klehm | 339/17 CF |
| 3,912,984 | 10/1975 | Lockhart | 339/17 CF |

*Primary Examiner*—Neil Abrams
*Attorney, Agent, or Firm*—Phillips, Moore, Weissenberger, Lempio & Majestic

[57] ABSTRACT

An integrated circuit socket particularly directed towards dual-in-line package (DIP) type circuits provide multilevel mounting for such integrated circuits. the socket body is formed to receive the first circuit package while the second circuit package is disposed above the first. Metallic contact members are disposed in holes arranged to coincide with the electrical leads subtending from each circuit. Each contact member is formed with means to clean and receive the coincident electrical leads from the first and second circuits. Insertion of the leads into the contact member scrapes surface dirt and corrosion from the lead to insure metal to metal contact. Each contact member is formed to engage the socket preventing inadvertent removal of the contact member. The contact members are sufficiently long to extend through the socket and an associated printed circuit board to which they may be readily soldered by conventional means. In the one embodiment the socket is unitary and is formed with longitudinal protruding spacer members to separate it from the circuit board. In a second embodiment the socket is modular.

9 Claims, 7 Drawing Figures

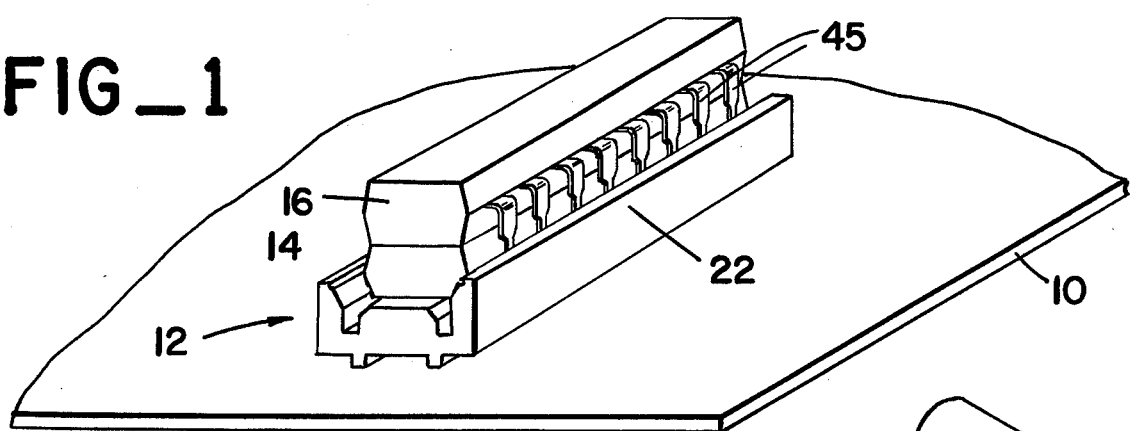
FIG_1
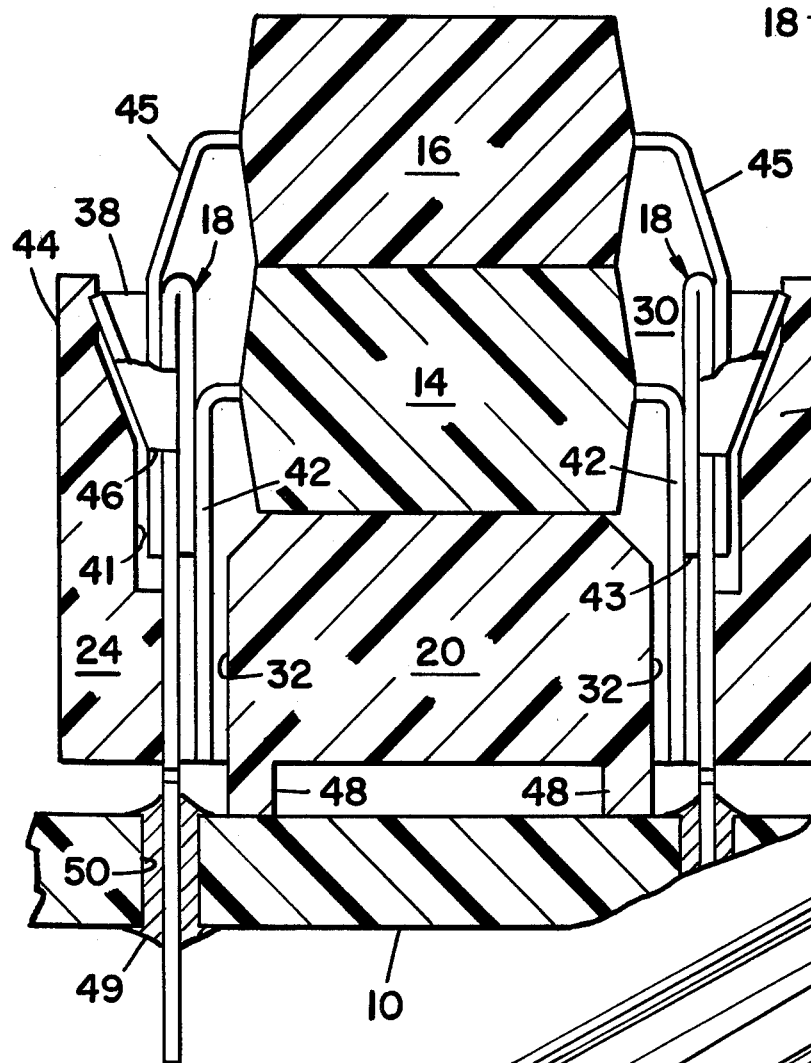
FIG_2
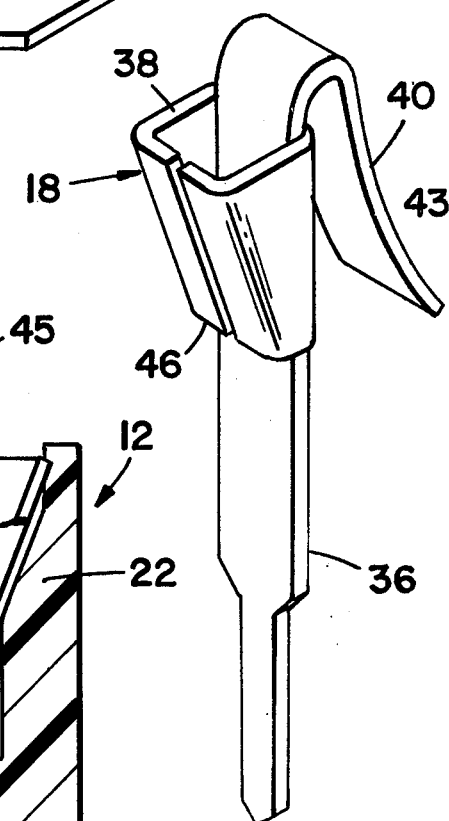
FIG_3
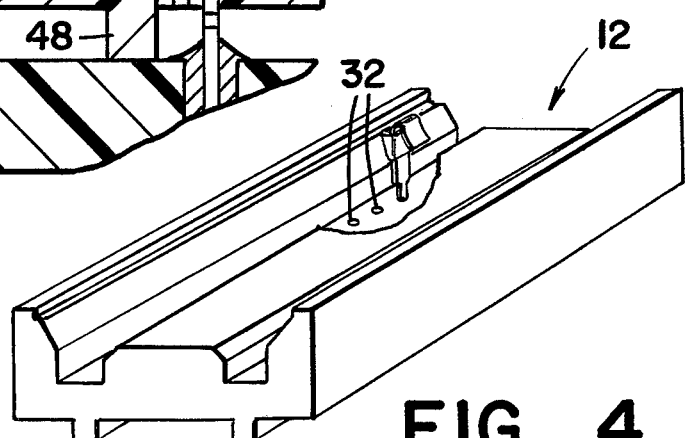
FIG_4

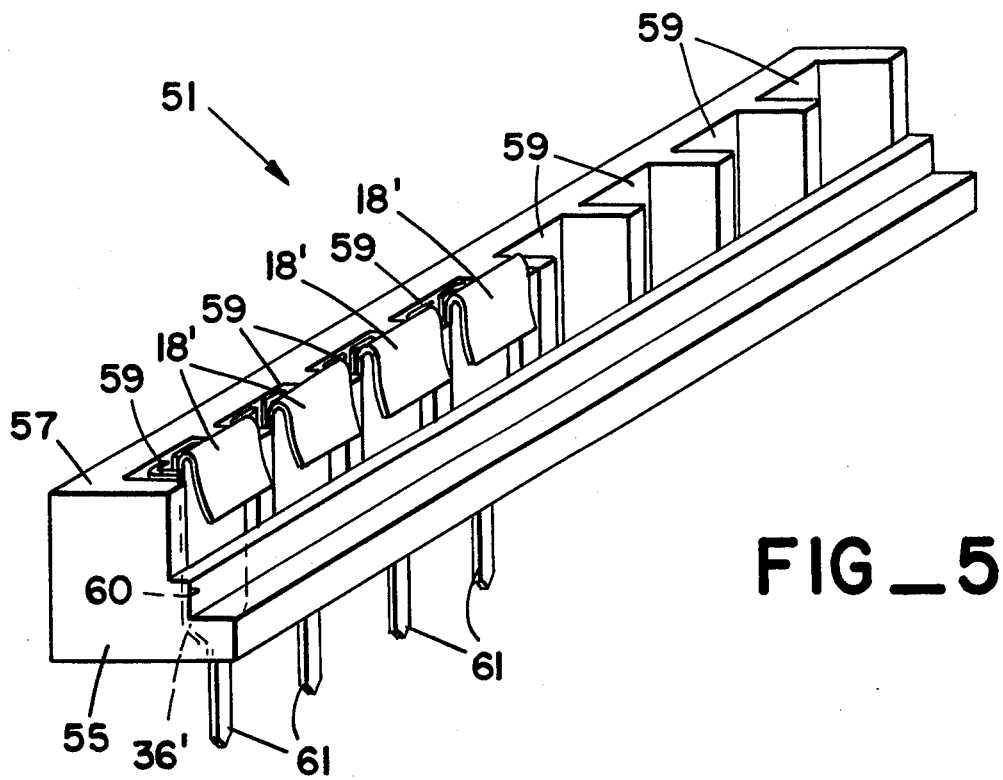
FIG_5
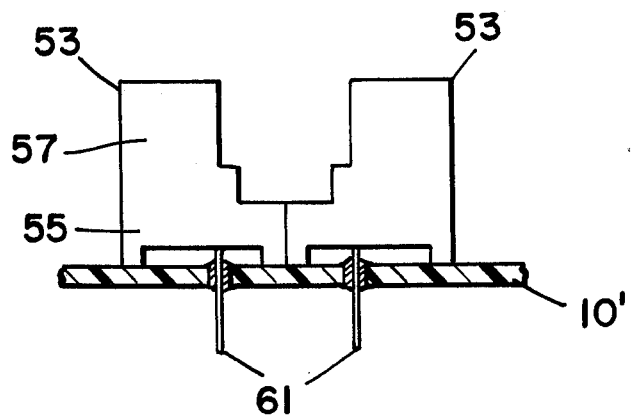
FIG_6
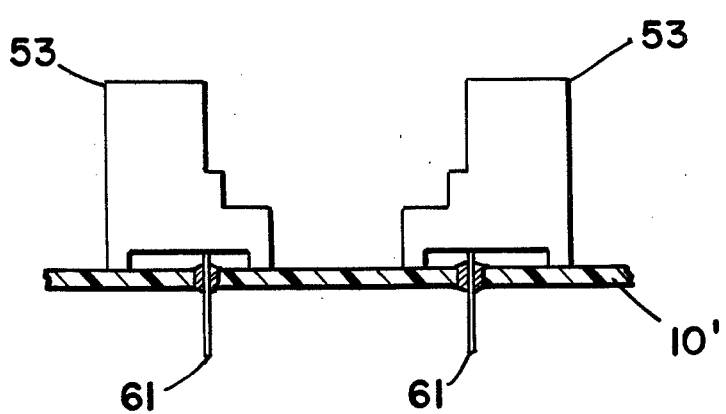
FIG_7

MULTI-LEVEL SOCKET FOR AN INTEGRATED CIRCUIT

BACKGROUND OF THE INVENTION

This invention relates to the mounting of integrated circuits, particularly dual-in-line packages commonly called DIPS. Such circuits are found in a large variety of electronic applications. Each individual DIP or dual-in-line package may perform a particular electronic function. In many cases this function is repetitive and requires a plurality of identical dual-in-line packages. A plurality of identical dual-in-line packages may be mounted on a single circuit board in an electronic device, which itself is comprised of a plurality of relatively widely separated circuit boards. Mounting of the dual-in-line package is normally accomplished through the use of a socket, however considerable space may be wasted by mounting only one layer of packages on the relatively widely separated circuit boards. It is not appropriate to decrease the distance between adjacent circuit boards as a portion of this space is necessary to allow cooling air to circulate in the device. It would be advantageous however to be able to mount at least two layers of dual-in-line package type integrated circuits in the same area now required to mount the single dual-in-line signal package type integrated circuit. Since dual-in-line package type integrated circuits come in several standard sizes, that is the length, width and contact leads are generally standardized, it is appropriate to design a standardized socket which permits stacking of the integrated circuits. The result of stacking of the circuits is the saving of up to fifty percent of the space requirements for the device.

SUMMARY OF THE INVENTION

Accordingly this invention provides a socket to be affixed to a conventional printed circuit board which permits stacking two integrated circuits, one atop the other. The socket includes contact pins that grip and retain the electronic package and which also extend through a conventional circuit board for soldering.

It is an object of this invention to provide an integrated circuit socket which allows for stacking of integrated circuits.

It is further an object of this invention to provide the aforedescribed socket which includes metal contact means for making electrical contact with the subtending leads from mounted integrated circuits.

It is still another object of this invention to provide the integrated circuit socket as described above wherein the metal contact means includes means to clean the subtending leads of a mounted integrated circuit upon mounting the circuit in the socket.

It is also an object of this invention to provide an integrated circuit socket which is economical to manufacture.

It is still another object of this invention to provide an integrated circuit socket wherein the metallic contact means may be soldered to a conventional printed circuit type board.

Broadly stated, the invention is a socket for integrated electrical circuits having a plurality of extending leads, the socket comprising a nonconductive elongated body. The nonconductive elongated body includes a base portion with an edge portion upstanding therefrom. The body defines a plurality of holes extending therethrough and aligned along the major axis and adjacent the edge portion thereof. At least two elongated metal contact members are each retainably positionable in holes to extend therethrough. Each metal contact member serves to frictionally retain one of the parallel extending leads of a first integrated electrical circuit, and provide a solderable contact distal of the integrated circuit.

These and other objects of the invention will become apparent from a study of the accompanying drawings and the following specification.

BRIEF DESCRIPTION OF THE DRAWINGS

FIG. 1 is a perspective view of an integrated circuit socket which is the subject of this invention shown in relation to a circuit board, the socket having two dual-in-line package type integrated circuits mounted therein.

FIG. 2 is a sectional view of the integrated circuit socket and integrated circuits shown in perspective in FIG. 1.

FIG. 3 is a detailed view of a metal contact member which may be utilized in the integrated circuit socket.

FIG. 4 is a view of the integrated circuit socket in perspective with one metal contact member installed therein.

FIG. 5 is a perspective view of an alternate embodiment of the integrated circuit socket formed of two modules.

FIG. 6 is an end view of the modular integrated circuit socket shown in FIG. 5 affixed to a circuit board for use with one size of integrated circuit.

FIG. 7 is an end view of the modular integrated circuit socket shown in FIG. 5 affixed to a circuit board for use with a second size of integrated circuit.

DETAILED DESCRIPTION OF THE PREFERRED EMBODIMENT

Referring now to FIG. 1, a portion of a circuit board 10 utilized in electronic circuitry is shown with a circuit socket 12 of the type envisioned by this invention mounted thereon. A first electronic package 14 in the form of a dual-in-line package and a second electronic circuit 16 also in the form of a dual-in-line package are shown mounted in socket 12. Dual-in-line packages in the form of electronic circuit 14 conform to rather rigid specifications, particularly in regard to the plurality of leads or subtending contact pins. Such dual-in-line packages may be made for example in 8 pin, 14 pin, 16 pin, and 18 pin or more configurations. Specifications for these dual-in-line packages have become generally standardized throughout the industry so that circuit boards and components utilized with circuit boards for mounting integrated circuits in the form of dual-in-line packages can conform to the standards. Accordingly, it is envisioned that socket 12 would be made in conformance with the standards of the industry to accept the various dual-in-line packages. Since the width dimension of at least the 8 pin, the 14 pin and the 16 pin dual-in-line package, that is the dimension between the rows of subtending pins is constant while other packages with more pins may be wider, and the dimension between each adjacent pin in all packages is the same, it is possible to make socket 12 in as few as two sizes, one to take the 8, 14, 16, and 18 pin dual-in-line packages and a second wider size to take 20 pin or larger dual-in-line packages. Alternatively, since the inter pin spacing in each row is constant, the socket can be modularized to two or more parts with the parts being positioned on the circuit board in accord with the particular dual-in-line package.

The preferred socket 12 is of the same general configuration with width between sides varying only. The contact pin 18, which is shown in FIG. 3, can be used in both configurations. Referring now to FIG. 2, the socket body, which is formed of a nonconductive material, has an elongated base portion 20. Upstanding from one side and unitarily formed with base portion 20 are parallel edge portions 22 and 24 which form a cavity 30 having a U shaped cross section in which the first integrated circuit 14 may be disposed. The base portion 20 defines a plurality of holes 32 which extend through the base portion from the interior of the cavity. The holes are adjacent edges 22 and 24 in two rows parallel with the longitudinal or major axis of socket 12 and separated one hole from the next adjacent hole by a predetermined distance substantially in conformance with the standards of the industry for the separation of the subtending pins of dual-in-line package type integrated circuits. In the preferred embodiment the separation of the rows of holes again conforms substantially to the standards for integrated circuits of the dual-in-line packaged type.

Disposed in each hole 32 is a metallic contact member hereinafter referred to as metallic contact pin 18 and which is generally of the configuration shown in FIG. 3. The configuration shown in FIG. 3 is exemplary of various configurations and is described to show certain features necessary for proper mounting of integrated circuits such as envisioned in this invention. Initially the contact pin must make good electric contact with the integrated circuit. Secondly, the metallic contact pin should be formed with a retentive feature in order to retain the integrated circuit or dual-in-line package in proximity with the socket. Finally, the metallic contact pin should be readily solderable. Metallic contact pin 18 accomplishes these three functions through the following features. The pin is integrally formed of a metal in the group which is easily solderable such as brass, bronze, silver, gold, a tin compound or the like. The pin 18 is comprised of an elongated leg portion 36 having a generally barbed shaped pocket 38 integrally formed at one end and on one side thereof. A folded over end is formed at the end proximate the barbed pocket. The contact pin 18 when inserted in a hole 32 is formed so that the barbed shaped pocket 38 engages the specially configured side portion 22 or 24 as the case may be. This will become more apparent during the succeeding discussion. Similarly, folded over end 40 resiliently extends outwardly into cavity 30 so that when the first integrated circuit or dual-in-line package 14 is disposed in cavity 30 the subtending contact lead 42 will contact the extreme edge 43 of folded over end 40. The edge 43 is made sufficiently sharp so that as the contact lead 42 depresses the resilient folded over end 40 adjacent the leg portion 36 of the contact pin, the edge 43 will scrape dirt and corrosion from the contact lead 42 to make a metal to metal contact therewith and also serve as means to retain the circuit in the cavity 30 adjacent base portion 20.

As previously mentioned, the barbed shaped pocket 38 contacts either side portion 22 or side portion 24. Side portion 22 and side portion 24 are identical in construction and differ only in that one is the reverse of the other, accordingly side portion 24 will be described. Side portion 24 has a vertical exterior surface 44 and an interior surface 41 which extends upwardly and outwardly from the base portion 20 to a point proximate the top of the socket where the surface extends vertically upwardly. With the first integrated circuit 14 positioned in cavity 30 the downwardly extending leads 42 contact the folded over ends 40 and, in addition to urging the folded over ends 40 toward leg portion 36, the contact leads 42 urge the two opposed contact pins 18 shown in FIG. 2 outwardly so that the barbed shaped pocket 38 makes harder contact with the upper portion of side portion 24 in a manner to better retain the contact pin 18 therein. Thus, as can be seen in FIG. 2, two contact pins 18 are disposed in opposite holes 32 in socket 12 with a first integrated circuit 14 disposed therein. The contact pins 18 are urged outwardly against the socket so that the barbed shaped pockets 38 engage the side portions thereof. The second integrated circuit 16 is disposed above the first integrated circuit 14 with the subtending leads 45 of the second integrated circuit extending downwardly through the barbed shaped pocket 38. The barbed shaped pocket 38 has an edge 46 for scraping clean the contact lead 45 of the second integrated circuit or dual-in-line package 16. This edge 46 also serves as means to retain the contact lead 45 in the socket in the manner of edge 43.

As can be seen, socket 20 is adapted to receive the first integrated circuit 14 with the subtending leads 42 interior of the contact pins 18. The second integrated circuit 16 is disposed on top of the first integrated circuit with the contact leads 45 of the second integrated circuit extending downwardly through the barbed shaped pockets 38. It should be understood that FIG. 2 is representative of a cross section only and there will be a number of contact pins 18 equal to the number of subtending contact leads of the mounted integrated circuits.

It is to be understood that socket 12 may be formed with protrusions 48 extending downwardly from the side of base 20 opposite edges 22 and 24 to separate base portion 20 from the circuit board 10. These protrusions 48 are purposely formed on the base portion to allow for cooling air to circulate beneath base portion 20 and further to separate the integrated circuit 14 and integrated circuit 16 sufficiently from the circuit board so that if contact pins 18 must be soldered or desoldered in circuit board 10 with the circuits in place the heat is substantially dissipated before reaching cavity 30. Of course, the contact pins 18 are normally soldered before mounting of the integrated circuits in the cavity. Referring now specifically to FIG. 2, it can be seen that contact pin 18, which is sufficiently long to extend through circuit board 10, is formed with a surface so that the soldered joint 49 formed adjacent to circuit board 10 may extend substantially through the hole 50 of the circuit board 10.

In operation, it is envisioned that a circuit board 10, which is to be utilized in an electronic circuit, has properly printed on one or more sides thereof a circuit in accord with the design of the desired circuit. This printing, which does not appear in the drawings would conform to a predetermined pattern. The contact pins 18 extending through the plurality of holes 50 in the circuit board 10 connect by solder at proper points with the appropriate printed circuit. Thus, a socket 12 with a plurality of contact pins 18 disposed in the aligned holes 32 and properly positioned on board 10 would provide for a "plug in" point for two integrated circuits of the dual-in-line package type. Specifically, socket 12 would be disposed on circuit board 10 with the pins 18 extending through the appropriate holes 50, then utilizing appropriate teaching well-known in the art, the pins 18 would be soldered to holes 50, either as a unit or individually. Then assembly of the circuit board could take place by disposing initially the first integrated circuit 14 or dual-in-line package into cavity 30. This, as mentioned above, will urge the pins 18 outwardly so that the barbed shaped pockets 38 will contact the side portions 22 and 24 of the socket to better retain the socket and the circuit adjacent circuit board 10. Edge 43 of each pin is concurrently scraping contact 42 to make adequate contact with contact 42. If it is desired to dispose a second integrated circuit or dual-in-line package type, the second circuit can be immediately disposed above the first circuit 14 so that leads 45 extend downwardly through barbed shaped pocket 38. It can be readily seen by those skilled in the art that, in those installations which require a large number of identical circuits, the circuits can be mounted in pairs while using this invention. This, of course, reduces space in the finished electronic package and secondly reduces cost in that only half of the number of leads must be soldered to the printed circuit.

A modularized socket is shown in FIGS. 5, 6, and 7 which conforms to the objects of the preferred embodiment wherein two dual-in-line packages may be mounted one above the other. The modularized socket 51 shown in FIG. 5 is comprised of at least two modules each of which is an elongated L shaped body 53 having a unitarily formed stepped base 55 and an upstanding side portion 57. In the embodiment shown in FIG. 5, individual pin cavities 59 are molded into the L-shaped body 53, with each individual pin cavity 59 formed to receive a metal contact pin 18' of the type described in the preferred embodiment. Each L-shaped body is further formed with a plurality of holes 60 each communicating with an individual pin cavity 59 and extending through the base portion 55. These holes 60 are each adapted to receive leg 36' of metal contact pin 18', which itself may have a narrowed lower portion 61.

In use, a pair of modules may be arranged in parallel-facing arrangement to form the modularized socket which may be affixed to a circuit board 10' as shown in FIG. 6 or FIG. 7. Electronic packages (not shown) such as dual-in-line packages may be disposed in the socket 51 in the same manner as in the preferred embodiment. The advantage of the modularized structure is that the same modules may be used for both the relatively narrow electronic circuits and for the relatively wide electronic circuits. These two mounting arrangements are shown in FIGS. 6 and 7.

Although this invention has been described specifically dealing with dual-in-line package type integrated circuit it is to be understood that those type electronic circuits which are used in large numbers in a single electronic device would be similarly mounted utilizing the teaching herein. Therefore, it is to be understood by those skilled in the art that this invention is limited only by the extent of the claims apended hereto.

I claim:

1. A multi-level socket for mounting a plurality of integrated electrical circuits, each circuit having a plurality subtending leads arranged in one or more rows, the socket comprising:

a non-conductive elongated body comprising a base portion and an edge portion unitarily formed with said base portion and upstanding from one side thereof, the body defining a plurality of holes extending through said base portion aligned along the major axis and adjacent to one edge portion thereof; and, at least two elongated metallic contact members each retainably positionable in one of said holes to extend therethrough, each metallic contact member having retention means for frictionally retaining one of the extending leads of a first integrated electrical circuit and each metallic contact member further having a solderable contact portion distal of the retention means; said retention means comprising an integrally formed pocket extending outwardly of the one side of said metallic contact member; said metallic contact member further having the end proximate, said pocket folded over to extend outwardly of the other side of said metallic contact member; said pocket formed to engage the interior side of the said edge portion with said contact member disposed in one of the holes of said nonconductive body.

2. The socket of claim 1 wherein the nonconductive elongated body further defines a plurality of mounting protrusions unitarily formed with and extending from the other opposite side of the base portion, said protrusions providing mounting surfaces for the socket and further wherein the elongated metal contact members extend outwardly beyond said protrusions.

3. The socket of claim 2 wherein the nonconductive elongated body further comprises a second edge unitarily formed with said base portion and upstanding from the same one side, parallel to and laterally spaced apart from the one edge portion; and further wherein the body defines a second plurality of holes extending through said base portion adjacent the second edge portion, said second plurality of holes laterally displaced a predetermined distance from and parallel to the first plurality of holes.

4. The socket of claim 2 in combination with a printed electronic circuit board having at least two perforations therethrough, the perforations spaced apart to correspond to the two elongated metal contact members, wherein the metal contact members are solderably positionable in said perforations.

5. The socket as set forth in claim 1 in combination with a second nonconductive elongated body of identical structure to the one nonconductive body of the socket and at least one additional metal contact member retainably positionable in one of the holes in the second nonconductive body whereby the one nonconductive body and the second nonconductive body may be arranged in a facing and parallel relation for receiving first and second integrated circuits.

6. The socket of claim 1 wherein the end proximate the pocket is resiliently biased away from the other side of the metallic contact member.

7. A multi-level socket for mounting a plurality of integrated electrical circuits, each circuit having a plurality of subtending leads arranged in one or more rows, the socket comprising:

a nonconductive elongated body comprising a base portion and spatially separated edge portions unitarily formed with said base portion and upstanding from the same one side thereof, the body defining a plurality of holes extending through said base portion aligned in two parallel rows along the major axis of the base portion, each row adjacent one edge portion; and, at least two elongated metallic contact members each retainably positionable in one of said holes to extend therethrough, each metallic contact member having a first retention means extending outwardly from one side thereof for frictionally retaining one of the extending leads of a first integrated electrical circuit and a second retention means extending outwardly from the other side of said elongated metallic contact member for frictionally retaining one of the extending leads of a second integrated electrical circuit so that the second integrated electrical circuit is retained adjacent to and above the first integrated electrical circuit relative the non-conductive elongated body, each metal contact member further having a solderable contact portion distal of the retention means;

said first retention means comprising an integrally formed pocket and further the second retention means comprising an integrally formed folded over end portion, said folded over end portion proximate said pocket;

said pocket formed to engage the interior side of the edge portion with said metallic contact member disposed in one of the holes of the non-conductive body.

8. The socket of claim 7 wherein the nonconductive elongated body further defines a plurality of mounting protrusions unitarily formed with and extending from the other opposite side of the base portion, said protrusions providing mounting surfaces for the socket and further wherein the elongated metal contact member extend outwardly beyond said protrusions.

9. The socket of claim 8 wherein the end proximate the pocket is resiliently biased away from the other side of the metallic contact pin.

* * * * *